(12) United States Patent
Becnel

(10) Patent No.: US 11,374,497 B2
(45) Date of Patent: Jun. 28, 2022

(54) METHODS AND SYSTEMS FOR POWER MANAGEMENT

(71) Applicant: Uplift Solar Corp., Las Vegas, NV (US)

(72) Inventor: Eric Dupont Becnel, Madison, AL (US)

(73) Assignee: UPLIFT SOLAR CORP., Las Vegas, NV (US)

( * ) Notice: Subject to any disclaimer, the term of this patent is extended or adjusted under 35 U.S.C. 154(b) by 0 days.

(21) Appl. No.: 17/361,197

(22) Filed: Jun. 28, 2021

(65) Prior Publication Data

US 2021/0328512 A1    Oct. 21, 2021

Related U.S. Application Data

(63) Continuation of application No. 16/949,959, filed on Nov. 20, 2020, now Pat. No. 11,081,962, which is a continuation of application No. PCT/US2020/023183, filed on Mar. 7, 2020.

(60) Provisional application No. 62/819,710, filed on Mar. 18, 2019.

(51) Int. Cl.
| | |
|---|---|
| *H02M 3/158* | (2006.01) |
| *H02S 40/30* | (2014.01) |
| *G06F 1/26* | (2006.01) |
| *H03K 3/017* | (2006.01) |

(52) U.S. Cl.
CPC ............ *H02M 3/1582* (2013.01); *G06F 1/26* (2013.01); *H02S 40/30* (2014.12); *H03K 3/017* (2013.01)

(58) Field of Classification Search
None
See application file for complete search history.

(56) References Cited

U.S. PATENT DOCUMENTS

| | | | | |
|---|---|---|---|---|
| 8,963,521 | B2 * | 2/2015 | Wei ..................... | H02M 3/1584 323/272 |
| 10,340,801 | B2 * | 7/2019 | Johnson .................. | H03B 5/08 |
| 2004/0196018 | A1 * | 10/2004 | Sutardja .............. | H03K 5/1565 323/283 |
| 2006/0125539 | A1 * | 6/2006 | Yoshikawa .............. | H03K 7/08 327/172 |
| 2010/0314947 | A1 * | 12/2010 | Baarman .............. | H04B 5/0037 307/104 |

(Continued)

*Primary Examiner* — Jeffery S Zweizig
(74) *Attorney, Agent, or Firm* — Womble Bond Dickinson (US) LLP

(57) ABSTRACT

An apparatus comprises a plurality of voltage sources, one or more processors embedded with the plurality of voltage sources, and memory storing processor executable instructions that, when executed by the one or more processors, cause the apparatus to modify duty cycles of the voltage sources, and to modify timing for each phase of a multiphase cycle. In some cases, the apparatus: transfers, for each phase of the multiphase cycle, power from a different source of a plurality of sources to a load; determines, for each phase of the multiphase cycle, an input voltage associated with the transferred power, an output voltage associated with the transferred power, and current from the source associated with the transferred power; determines a duty cycle associated with the source; modifies duty cycles of the voltage sources; and modifies timing for each phase of the multiphase cycle.

25 Claims, 11 Drawing Sheets

(56) References Cited

U.S. PATENT DOCUMENTS

2015/0207335 A1* 7/2015 Madawala .............. H02J 50/40
　　　　　　　　　　　　　　　　　　　　307/104

* cited by examiner

METHODS AND SYSTEMS FOR POWER MANAGEMENT

CROSS REFERENCE TO RELATED PATENT APPLICATION

This application is a continuation of co-pending U.S. patent application Ser. No. 16/949,959 filed on Nov. 20, 2020, which is a continuation of PCT Patent Application No. PCT/US2020/023183 filed on Mar. 7, 2020, which claims priority to U.S. Provisional Patent Application No. 62/819,710 filed on Mar. 18, 2019, and these applications are hereby incorporated herein by reference for all purposes.

BACKGROUND

Power conversion and routing methods employ power convertors (e.g., boost convertors, step-up convertors, switched mode power supplies, etc.) to increase power in electrical circuits. The duty cycles of solid-state devices, such as transistors, are controlled to operate as switches to control current flow within boost convertors. Intermittent current to the load from switched mode power supplies require extensive and expensive filtering techniques.

SUMMARY

Described are methods comprising transferring, for each phase of a multiphase cycle, power from a different source of a plurality of sources to a load, determining, for each phase of the multiphase cycle, an input voltage associated with the transferred power, an output voltage associated with the transferred power, and current from the source associated with the transferred power, determining a duty cycle associated with the source, modifying, based on the input voltage associated with the transferred power, the output voltage associated with the transferred power, the current from the source, the duty cycle associated with the source: wherein the modified duty cycle comprises an increase or a decrease in the duty cycle associated with the source based on one or more of the input voltage not satisfying an input voltage level threshold, the output voltage satisfying an output voltage level threshold, or the current from the source exceeding a current level threshold, and modifying, based on the modified duty cycle, timing for each phase of the multiphase cycle.

Also described are methods comprising determining, for each phase of a multiphase cycle, one or more parameter values associated with output power (e.g., power transferred to a load, etc.), modifying, based on the one or more parameter values, the duty cycle of a synchronization switching component associated with the phase, and causing, based on the modified duty cycle for each phase of the multiphase cycle, an equivalent transition time between each phase of the multiphase cycle.

Also described are methods comprising transferring, for each phase of a multiphase cycle, power from a different source of a plurality of sources to a load, determining, for each phase of the multiphase cycle, based on an input voltage associated with source and current drawn from the source, an amount of power transferred from the source to the load, and modifying, based on the amount of power transferred from the source to the load, current drawn from the source.

Additional advantages will be set forth in part in the description which follows or may be learned by practice. The advantages will be realized and attained by means of the elements and combinations particularly pointed out in the appended claims.

BRIEF DESCRIPTION OF THE DRAWINGS

The accompanying drawings, which are incorporated in and constitute a part of this specification, illustrate embodiments and together with the description, serve to explain the principles of the methods and systems for power management.

DETAILED DESCRIPTION

Figure 1:
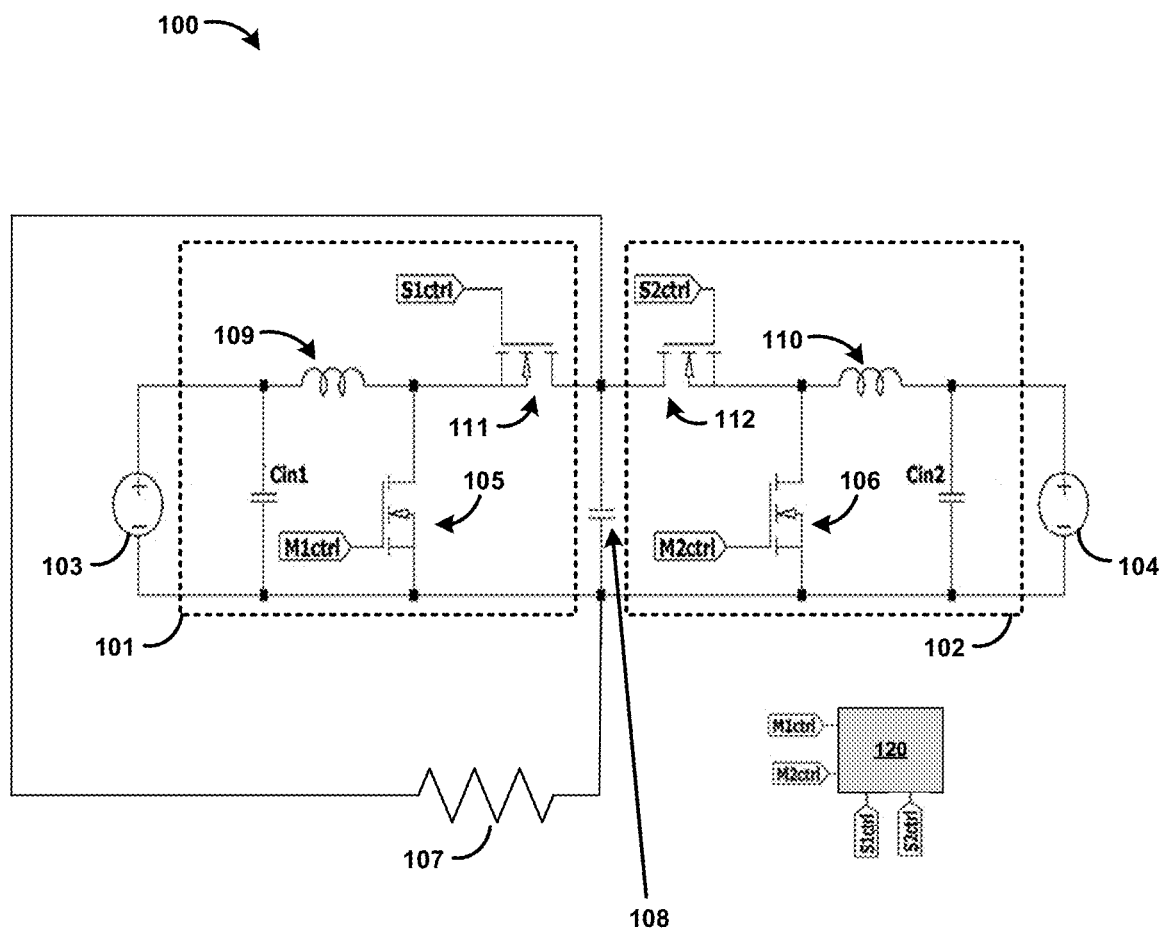
FIG. 1 is an example system for power management.

Before the present methods and systems are disclosed and described, it is to be understood that the methods and systems are not limited to specific methods, specific components, or to particular implementations. It is also to be understood that the terminology used herein is for the purpose of describing particular embodiments only and is not intended to be limiting.

As used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other components, integers or steps. "Exemplary" means "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems may be understood more readily by reference to the following detailed description of preferred embodiments and the examples included therein and to the Figures and their previous and following description.

As will be appreciated by one skilled in the art, the methods and systems may take the form of an entirely hardware embodiment, an entirely software embodiment, or an embodiment combining software and hardware aspects. Furthermore, the methods and systems may take the form of a computer program product on a computer-readable storage medium having computer-readable program instructions (e.g., computer software) embodied in the storage medium. More particularly, the present methods and systems may take the form of web-implemented computer software. Any suitable computer-readable storage medium may be utilized including hard disks, CD-ROMs, optical storage devices, or magnetic storage devices.

Embodiments of the methods and systems are described below with reference to block diagrams and flowchart illustrations of methods, systems, apparatuses and computer program products. It will be understood that each block of the block diagrams and flowchart illustrations, and combinations of blocks in the block diagrams and flowchart illustrations, respectively, can be implemented by computer program instructions. These computer program instructions may be loaded onto a general purpose computer, special purpose computer, or other programmable data processing apparatus to produce a machine, such that the instructions which execute on the computer or other programmable data processing apparatus create a means for implementing the functions specified in the flowchart block or blocks.

These computer program instructions may also be stored in a computer-readable memory that can direct a computer or other programmable data processing apparatus to function in a particular manner, such that the instructions stored in the computer-readable memory produce an article of manufacture including computer-readable instructions for implementing the function specified in the flowchart block or blocks. The computer program instructions may also be loaded onto a computer or other programmable data processing apparatus to cause operational steps to be performed on the computer or other programmable apparatus to produce a computer-implemented process such that the instructions that execute on the computer or other programmable apparatus provide steps for implementing the functions specified in the flowchart block or blocks.

Accordingly, blocks of the block diagrams and flowchart illustrations support combinations of means for performing the specified functions, combinations of steps for performing the specified functions and program instruction means for performing the specified functions. It will also be understood that each block of the block diagrams and flowchart illustrations, and combinations of blocks in the block diagrams and flowchart illustrations, can be implemented by special purpose hardware-based computer systems that perform the specified functions or steps, or combinations of special purpose hardware and computer instructions.

Note that in various instances this detailed disclosure may refer to a given entity performing some action. It should be understood that this language may in some cases mean that a system (e.g., a computer) owned and/or controlled by the given entity is actually performing the action.

Methods and systems for power management are described. The methods and systems described herein enable phase tuning of imbalanced power (energy) sources to improve power conversion efficiency. A control module and circuitry may be configured (e.g., embedded, etc.) with a power source(s), such as cells of a photovoltaic module (e.g., solar module, etc.) or multi-cell battery. The control module and circuitry may be used to transfer power (e.g., wattage) from the power source (e.g., components of the power source, etc.) to a load (e.g., a power inverter, an energy storage device, a heating element, a resistive load, an inductive load, a capacitive load, etc.) while minimizing output voltage transients (e.g., caused by intermittent current to the load from switched mode power supplies, etc.) by tuning the phase of discrete source components of the power source. For example, for a two-phase system the phases may have a 180 degree phase difference. The phase angle may be tuned based on the quantity of phases of the system (e.g., a three phase system, a four phase system, a polyphase system, etc.). The control module and circuitry may be used to manage switching (e.g., on/off, etc.) characteristics (e.g., duty cycle, etc.) of the connections of the power source(s) to produce optimal characteristics for power conversion, such as a reduced final output ripple or reduced output ripple before some final smoothing 108.

FIG. 1 is a diagram of a system 100 for power management. The system 100 may utilize a multi-phase control method that increases the voltage generated by power sources, such as photovoltaic cells of a solar module, one or more cells of a multi-cell battery/source, one or more energy harvesting devices (e.g., energy harvesting devices configured/embedded within an organic organism (e.g., jellyfish, etc.) and/or organic material (e.g., muscle tissue, etc.)). The system 100 may include a control module 120 that manages the timing of power delivery onset to an output so that the transients due to transitions of current outputs from interleaved power sources of the system 100 reduces the output filtering required while maximizing the power (e.g., wattage) accessed/sourced by a power source. The system 100 may include circuitry that steps up (e.g., increases, boost, etc.) voltage (while stepping down current) from a source when applied to a load. For example, the system 100 may include circuitry for a boost converter 101 and a boost converter 102. In some instances, the boost converter 101 and the boost converter 102 may be configured as an integrated circuit (IC) and/or the like. In some instances, the boost converter 101 and the boost converter 102 may be configured with discrete components, such as capacitors, resistors, inductors, power transistors, power transistor derivatives (e.g., bipolar junction transistors (BJTs), metal-oxide semiconductor field-effect transistors (MOSFETs), insulated gated bipolar transistors (IGBTs), thyristors, etc.). The boost converter 101 may step up (e.g., increases, boost, etc.) voltage (while stepping down current) from a source 103 and the boost converter 102 may step up (e.g., increases, boost, etc.) voltage (while stepping down current) from a source 104.

The source 103 and the source 104 may be any voltage source. For example, the source 103 and the source 104 may each be a photovoltaic cell of a photovoltaic cell-string (e.g., solar module, etc.), a cell of a multi-cell battery, or an energy-harvesting device (e.g., an energy-harvesting device associated with an organic organism, an energy-harvesting device associated with a thermoelectric device, etc.). In some instances, when voltage generated by the source 103 and the source 104 are at equal levels (e.g., the source 103 and the source 104 operating under the same conditions, etc.), the boost converter 101 and the boost converter 102 may operate 180 degrees out of phase with similar duty cycles. When voltage generated by the source 103 and the source 104 are at differing levels, the phase and duty cycle of the boost converter 101 and the boost converter 102 may be tuned to produce optimal performance (e.g., minimum voltage ripple, etc.) to a load 107 (an internal load, and external load, etc.). For example, a 180 degree phase shift (when measured at the center point of the off-state conduction) may be maintained for a 2 phase system to cause symmetric transition between and a reduction in output voltage ripple (e.g., the lowest possible output voltage ripple, etc.). In some instances, the system 100 may be scaled to any number of sources/phases. When each phase has different duty cycles the phase timing may be adjusted, for example, to cause equivalent transition periods between phases. Active duty cycle (and phase) management based on the performance of the sources (e.g., the source 103 and the source 104, etc.) enables the system 100 to require less output filtering, such as filtering by an output capacitor 108 (e.g., the capacitance value of capacitor 108 may be reduced, etc.). In some instances, the system 100 may not include the output capacitor 108 in parallel with the load 107. In instances when the system 100 does not include the output capacitor 108, fluctuations (e.g., spike, etc.) in power output by the system 100 may be fed to an external capacitor.

The phases of the boost converter 101 and the boost converter 102 may be controlled by a control module 120 (e.g., controller/driver module, multiphase controller, etc.). As described, in some instances, the system 100 may be scaled. For example, the system 100 may be scaled to include any number of sources, respective boost converters associated with the sources, and any number of respective phases control controlled by the control module 120. For example, the system 100 may be a two-phase system (as shown), a three-phase system, a four-phase system, or an n-th phase system (where n denotes any numeric value greater than 1). The control module 120 may include a processor, a logic chip, a microcontroller (MCU), a central processing unit (CPU), a field programmable gate array (FPGA), an application-specific integrated circuit (ASIC), and/or the like. In some instances, the control module 120 and/or the boost converter 101 and the boost converter 102 may be embedded (configured) with the sources (e.g., the source 103, the source 104, etc.) and the output capacitor 108. For example, the control module 120 and/or the boost converter 101 and the boost converter 102 may be embedded (configured) within a solar module that includes multiple photovoltaic submodules. The control module 120 may control power transferred to a load 107 from the source 103 and the source 104. The load 107 may be any component that consumes power.

In some instances, the current (and/or voltage polarity) for the system 100 may be reversed, causing current from the load 107 to be sent a source (e.g., the source 103, the source 104, etc.). The increased (high) voltage at the load 107 relative to the source allows current to reverse direction, if desired, and to be consumed by the source (e.g., the source 103, the source 104, etc.). For example, the current of the system 100 may be reversed to cause one or more photovoltaic cells of solar module to generate heat (e.g., heat up, light up, etc.). In some instances, the current of the system 100 may be reversed, for example, by the control module 120 causing a turn on of a sync switch (e.g., a synchronization transistor, an n-type MOSFET, sync switch 111, sync switch 112, etc.) to activate, turn on (e.g., transition from an off-state to an on-state, etc.), and/or the like at a time period when a boost convertor (e.g., the boost converter 101, the boost converter 102, etc.) is operating below a load voltage. Turning on a sync switch when a boost convertor operating below its load voltage may cause current to flow (from an internal busbar/rail to an associated inductor (e.g., an inductor 109, an inductor 110, etc.). By modifying the duty cycles and/or voltage on a main switch, the control module 120 may actively control the rate at which the solar module heats up. As another example, the current of the system 100 may be reversed to induce current in neurons and/or muscle fibers, induce varying charge levels in cells of a multi-cell battery, control one or more electrostimulation device (e.g., associated with organic material, etc.) and/or the like.

The control module 120 may actively modify/change (e.g., tune, etc.) the duty cycle of a main switch 105 associated with the boost converter 101 and a main switch 106 associated with the boost converter 102. The main switch 105 and the main switch 106 may be transistors (e.g., n-type MOSFETs, etc.) or any other switching component and/or semiconductor. The control module may actively modify/change (e.g., tune, etc.) the duty cycle of the main switch 105 and the main switch 106 of each phase in order to control the power transferred from the source 103 and the source 104, respectively, for each phase. For example, M1ctrl and M2ctrl indicate the electrical connections between the main switch 105 and the main switch 106, respectively, with the controller 120.

The control module 120 may modify/change (e.g., tune, etc.) the active duration (e.g., duty cycle) of the main switch 105 and the main switch 106. The controller 120, by activating M1ctrl and M2ctrl, may cyclically cause the main switch 105 and the main switch 106 to conduct electricity (e.g., activate, turn on, etc.). When the main switch 105 is "on," (e.g., conducting electricity, etc.), the source 103 may sink current in series through an inductor 109 and the main switch 105, then back to the source 103 (via a short circuit) causing the inductor 109 to generate a magnetic field. When the main switch 105 is switched "off" (e.g., not conducting electricity, etc.), the impedance through the main switch 105 may increase and cause the voltage across the inductor 109 to increase. When the main switch 105 is switched "off" (e.g., not conducting electricity, etc.), the control module 120 may cause, by activating S1ctrl (via a digital control signal, etc.), a sync switch 111 (e.g., a synchronization transistor, an n-type MOSFET, etc.) to activate, turn on (e.g., transition from an off-state to an on-state, etc.), and/or the like. When the sync switch 111 is active, the increased voltage across the inductor 109 may be conducted to the load 107 and the capacitor 108 (e.g., an output capacitor), causing the magnetic field produced by the inductor 109 to be reduced. During a different phase, When the main switch 106 is "on," (e.g., conducting electricity, etc.), the source 104 may sink current in series through an inductor 110 and the main switch 106, then back to the source 104 (via a short circuit) causing the inductor 110 to generate a magnetic field. When the main switch 106 is switched "off" (e.g., not conducting electricity, etc.), the impedance through the main switch 106 may increase and cause the voltage across the inductor 110 to increase. When the main switch 106 is switched "off" (e.g., not conducting electricity, etc.), the control module 120 may cause, by activating S2ctrl, a sync switch 112 (e.g., a synchronization transistor, an n-type MOSFET, etc.) to activate, turn on (e.g., transition from an off-state to an on-state, etc.), and/or the like. When the sync switch 112 is active, the increased voltage across the inductor 110 may be conducted to the load 107 and the capacitor 108, causing the magnetic field produced by the inductor 110 to be reduced. The control module 120 may modify/change (e.g., tune, etc.) the active duration (e.g., duty cycle) of the sync switch 111 and the sync switch 112 to avoid overvoltage output conditions.

The control module 120 may be configured with control logic for managing activation (e.g., duty cycles, etc.) of the main switch 105, the main switch 106, the sync switch 111, and the sync switch 112 in response to conditions affecting the source 103 and/or the source 104 to optimize power transferred to the load 107. For example, when voltage associated with the source 103 and/or the source 104 is reduced, the control module 120 may increase the duty cycles of the main switch 105 and/or the main switch 106, respectively, to enable more time for the strength of the magnetic fields of the inductor 109 and the inductor 110, respectively, to increase to a level that produces a target/ideal output voltage across the load 107. As another example, when current from the source 103 and/or the source 104 is reduced, the control module 120 may decrease the duty cycles of the main switch 105 and/or the main switch 106, respectively, to maintain a peak power point by causing less (on average) current to be drawn across the inductor 109 and the inductor 110, respectively, to produce a target/ideal output voltage across the load 107. Additionally, the control module 120 may modify/change the duty cycles of the sync switch 111 and the sync switch 112, respectively, based on a relationship between the voltage associated with the source 103 and/or the source 104, and the output voltage (e.g., the voltage across the load 107).

Assuming ideal conditions, the control module 107 may modify/change the duty cycles of the main switch 105, the main switch 106, the sync switch 111, and the sync switch 112, respectively, based on the following equations:

$$\text{Duty Cycle}_{main\ switch\ 105} = \frac{V_{out} - V_{source\ 103}}{V_{out}} \quad (1)$$

$$\text{Duty Cycle}_{main\ switch\ 106} = \frac{V_{out} - V_{source\ 104}}{V_{out}} \quad (2)$$

$$\text{Duty Cycle}_{sync\ switch\ 111} = \frac{V_{source\ 103}}{V_{out}} \quad (3)$$

$$\text{Duty Cycle}_{sync\ switch\ 112} = \frac{V_{source\ 104}}{V_{out}}, \quad (4)$$

where $V_{out}$ is the voltage across the load 107. In some instances, the equations described may deviate based on one or more real world occurrences, such as in situations of inducing overvoltage output conditions and/or the like. In some cases, the control module 107 may modify/change the duty cycles of any switch (transistor) of the system 100 (e.g., the main switch 105, the main switch 106, the sync switch 111, the sync switch 112, etc.) based on any relationships between the output voltage (e.g., $V_{out}$) and voltage and/or current associated with a source that optimizes the output voltage.

In some instances, such as when controlling a two phase system, the control module 120 may control timing for phases (e.g., signals, pulses, pulse trains, etc.) of the system 100 such that each phase is sequenced so that the center of the on-state (e.g., the active/conducting duration of the duty cycle) duration for the respective synchronization switch (e.g., the sync switch 111, the sync switch 112, etc.) has a phase angle of 180 degree relative to the next phase. The control module 120 may control timing for phases of any multiphase system with interleaved sources so that the timing/duration between phases is equivalent. For a multiphase system, the control module 120 may cause the centers of the "on" states for synchronization switches to be aligned to cause the sum of the phases to be evenly distributed when the control module 120 modifies/changes the respective duty cycle. As such, under ideal conditions, the voltage ripple ($V_{outRipple}$) across the output capacitor 108 may be determined by the following equation:

$$V_{outRipple} = \frac{I_{out}}{C_{capacitor108}} \left| \frac{V_{out} - V_{sources}}{V_{out}} \right| \left| \frac{1}{\text{Frequency} * n_{phase}} \right|,$$

where $n_{phase}$ represents the number of sources/phases (e.g., the source 103, the source 104, etc.) for the system 100, and $V_{sources}$ represents the total voltage of the sources/phases. Based on the desired output of the system 100 (e.g., a given set of output requirements that specify current level, voltage level, etc.), an equivalent time distribution in current flowing to the capacitor 108 provides a lowest possible current ripple. The low current ripple may cause the system 100 to require less filtering that traditional power management systems, such as single phase systems. The reduced filtering requirements of the system 100 renders the system 100 cost effective (e.g., fewer components, reduced component values, etc.) and functionally versatile (e.g., reduced size, reduced heat, embeddable assembly, etc.) in comparison to traditional power management systems.

Figure 2:
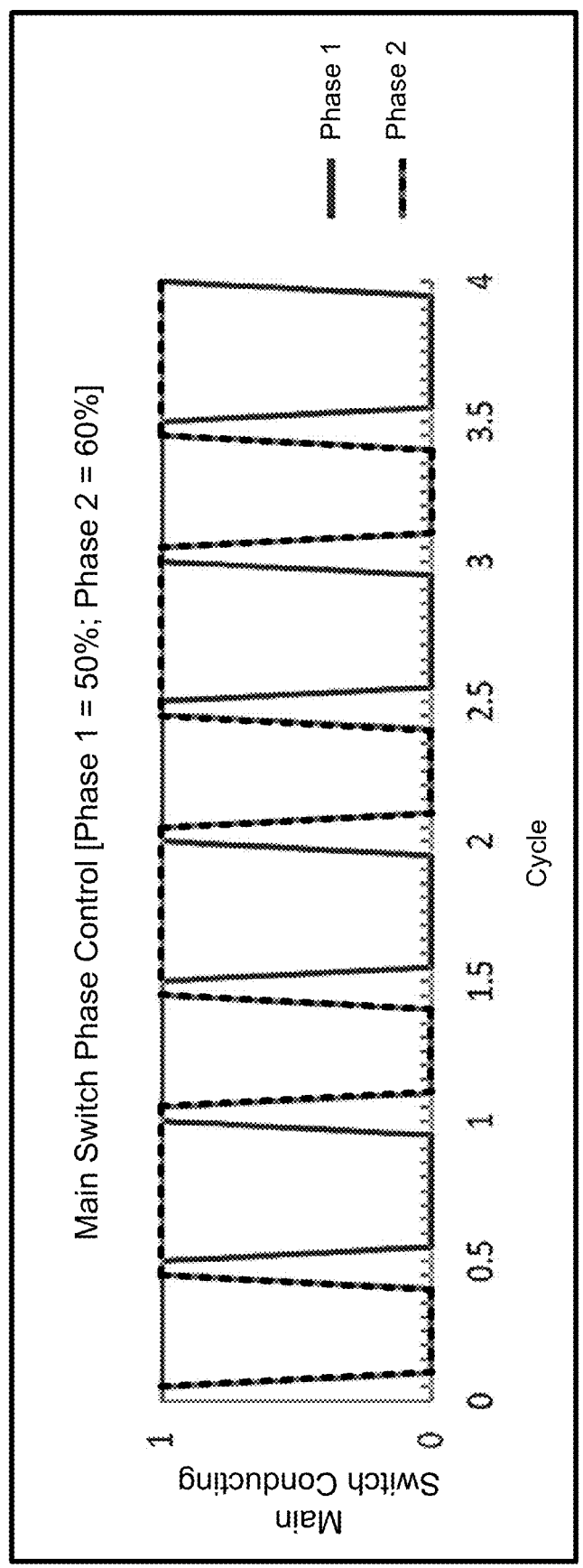
FIG. 2 is a diagram for power management.
Figure 3:
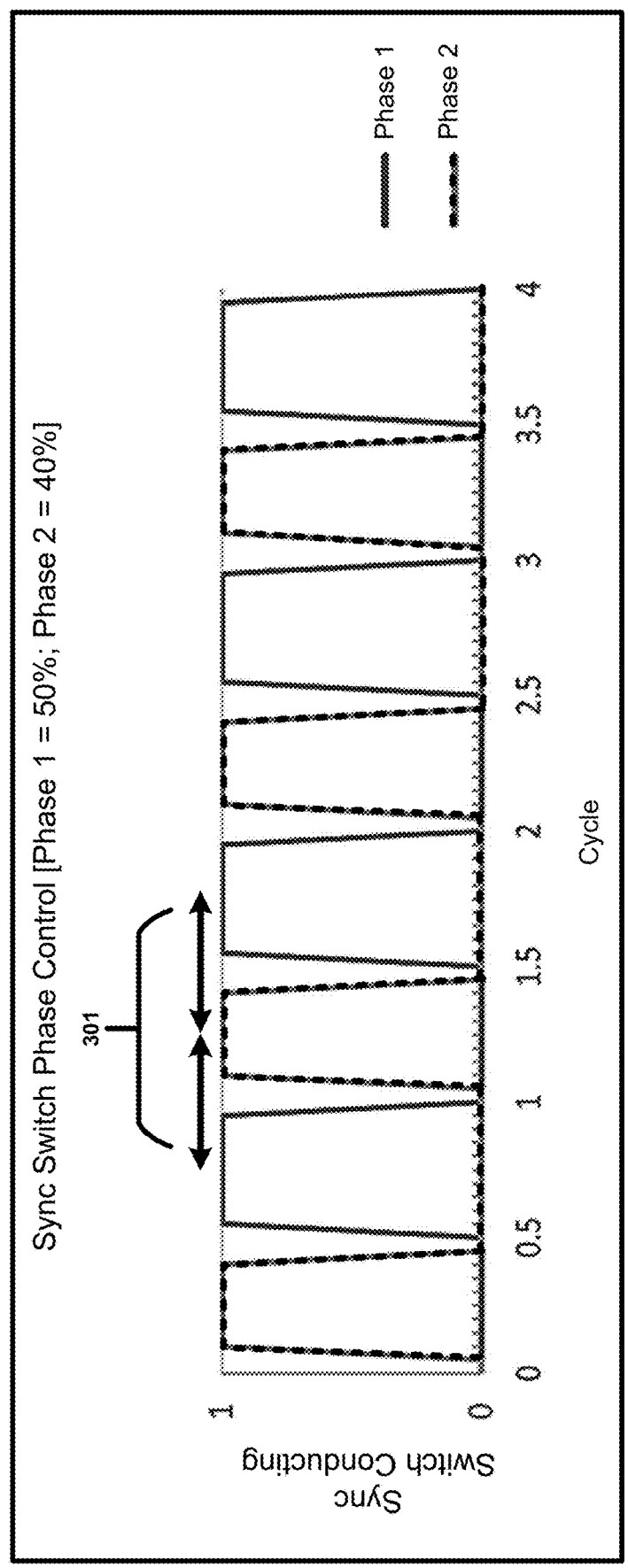
FIG. 3 is a diagram for power management.
Figure 4:
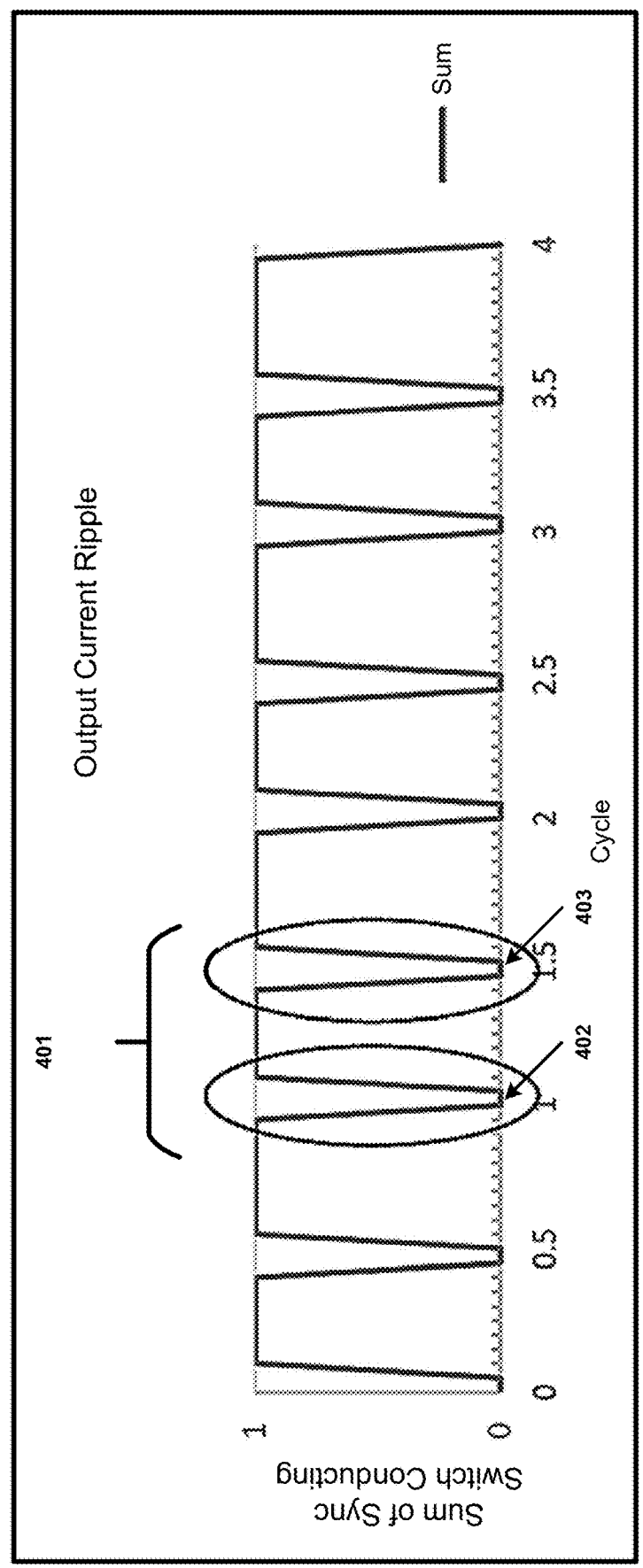
FIG. 4 is a diagram for power management.

FIGS. 2-4 are timing diagrams of the system 100 (configured as a two-phase system). FIG. 2 is a timing diagram illustrating the phase control of the system 100 (configured as a two-phase system) where the control module 120 causes a duty cycle of the main switch 105 to have a duty cycle of fifty percent (50%) and the main switch 106 to have a duty cycle of sixth percent (60%). FIG. 3 is a timing diagram illustrating the phase control of the system 100 (configured as a two-phase system) where the control module 120 causes a duty cycle of the sync switch 111 to have a duty cycle of fifty percent (50%) and the sync switch 112 to have a duty cycle of forty percent (40%) for the entire duration of each phase that the main switch 105 or the main switch 106 is disabled, respectively. As illustrated at 301, there is a fifty percent (50%) phase delay between the centers of the conduction cycles. FIG. 4 is a timing diagram of the output current ripple of the system 100 (configured as a two-phase system). The sum of the "on" time (e.g., the active/conducting duration of the duty cycle) for the sync switch 111 and the sync switch 112 is ninety percent (90%), implying a down ("off") time of ten percent (10%). As shown 401, the 10% down ("off") time is evenly distributed into two 5% down ("off") times (e.g., 402, 403, etc.) between the phases.

Figure 5:
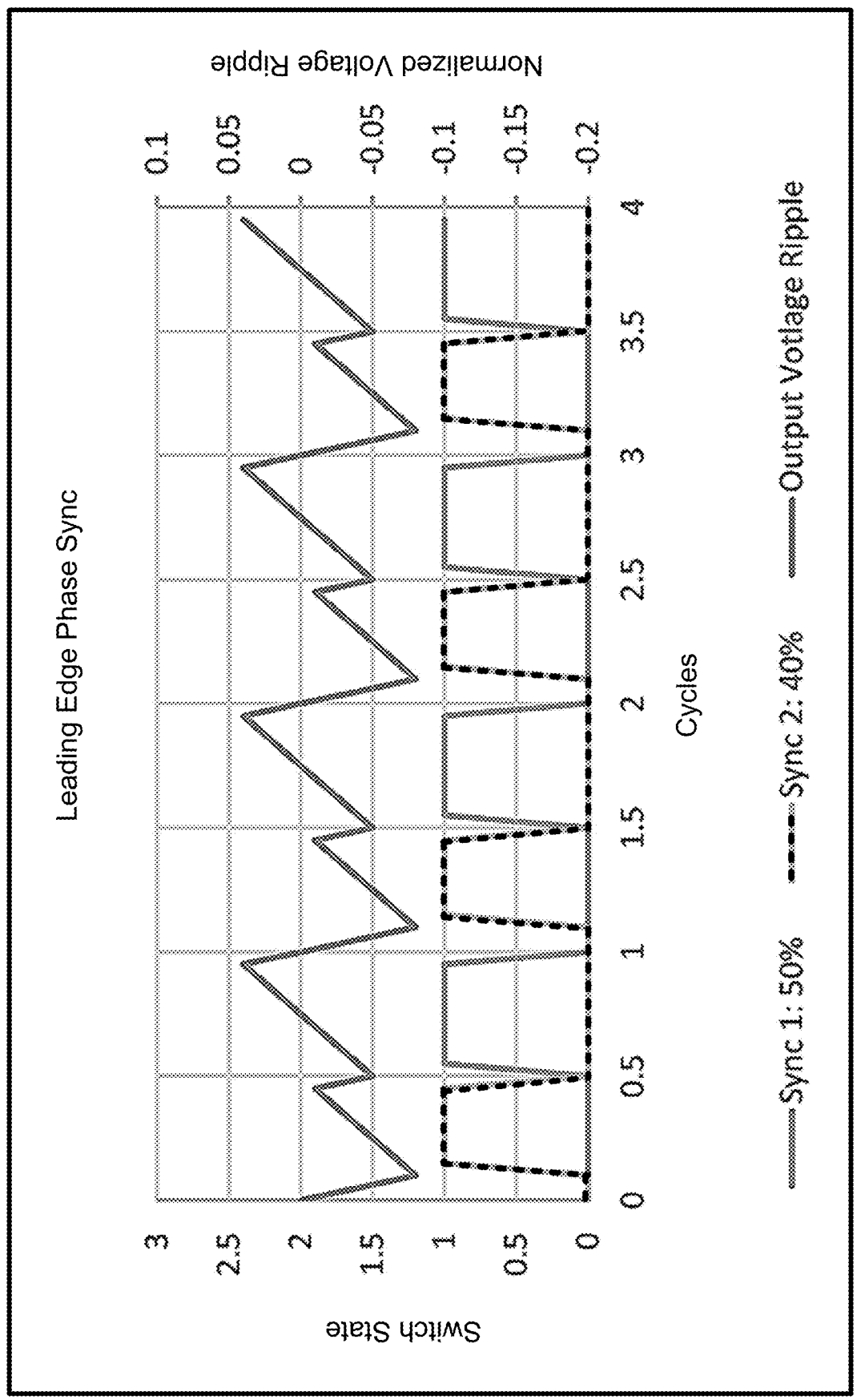
FIG. 5 is a diagram for power management.

FIG. 5 plots the phases of the sync switches in relation to the output voltage ripple of a two phase system with boost converters connected to independent sources and the leading edges (as opposed to the center) of the respective signals are managed by the control model 120 for phase control. The sum of the "on" time (e.g., the active/conducting duration of the duty cycle) for the sync switches is ninety percent (90%). As shown in FIG. 5, the normalized voltage ripple of the two phase system independent source system is 0.12. The normalized voltage ripple of 0.12 is caused by a larger phase gap following the current delivery by the sync switch.

Figure 6:
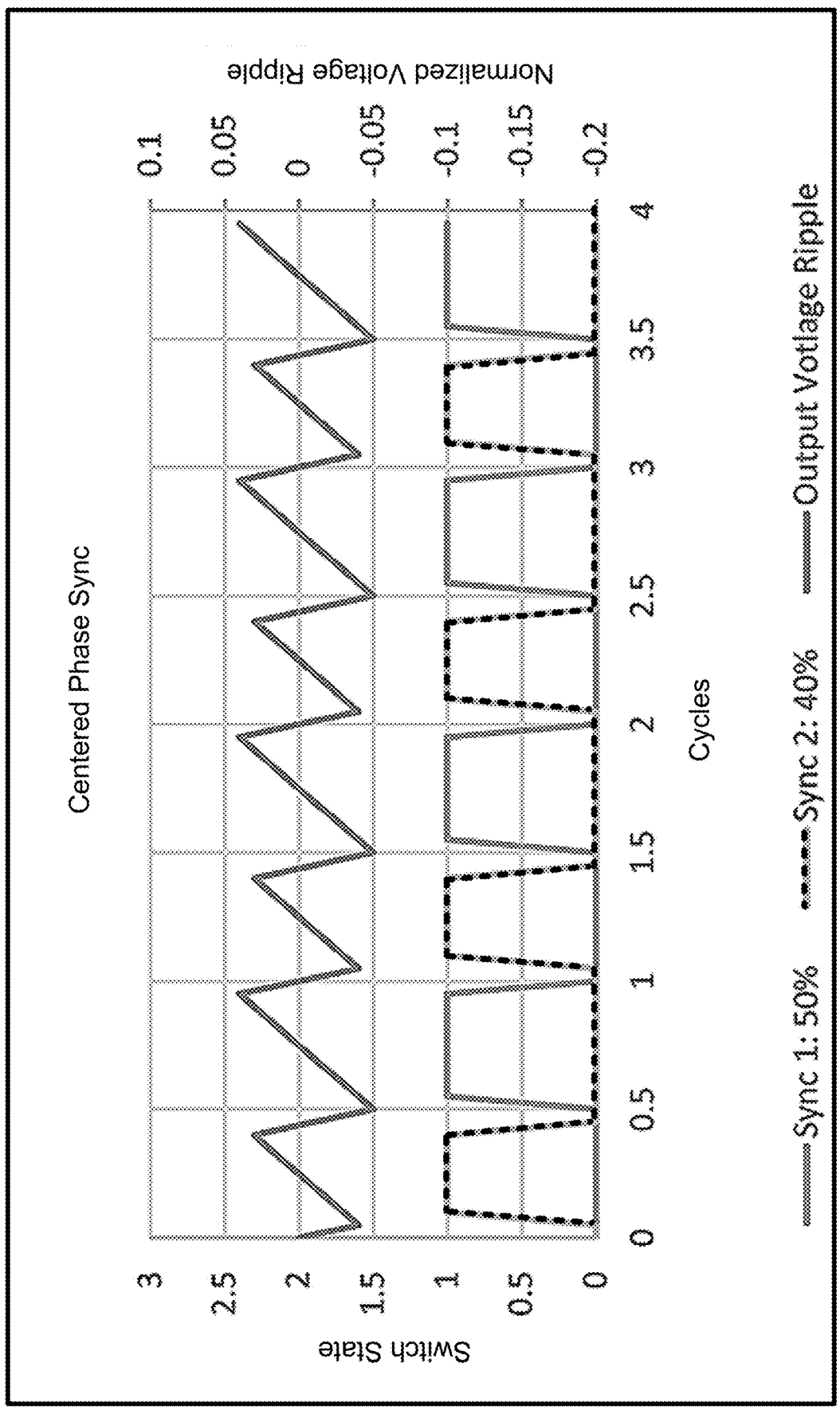
FIG. 6 is a diagram for power management.

FIG. 6 plots the phases of the sync switches (e.g., the sync switch 111, the sync switch 112) in relation to the output voltage ripple, when the center phases of the respective signals are managed by the control model 120 for phase control of the system 100. For example, the control model 120 may cause the sum of the "on" time (e.g., the active/conducting duration of the duty cycle) for the sync switch 111 and the sync switch 112 to be ninety percent (90%). As shown in FIG. 6, the normalized voltage ripple of the system 100 is 0.09. The normalized voltage ripple of 0.09 is caused by a balance of the phase gaps following the current delivery (to the load 107) by the sync switch 111 and the sync switch 112. FIG. 6 illustrates that when the control model 120 causes a sync switch (e.g., the sync switch 111 and the sync switch 112) to conduct, current transferred to the load causes a voltage increase. When the control model 120 causes a sync switch (e.g., the sync switch 111 and the sync switch 112) to stop conducting, there is a sharp decrease in voltage as the capacitor 108 sustains the current to the load 107. FIG. 6 illustrates that when the control module 120 causes equivalent transition timing between phases, peak electrical transients are minimized (see FIG. 5 for comparison).

Figure 7:
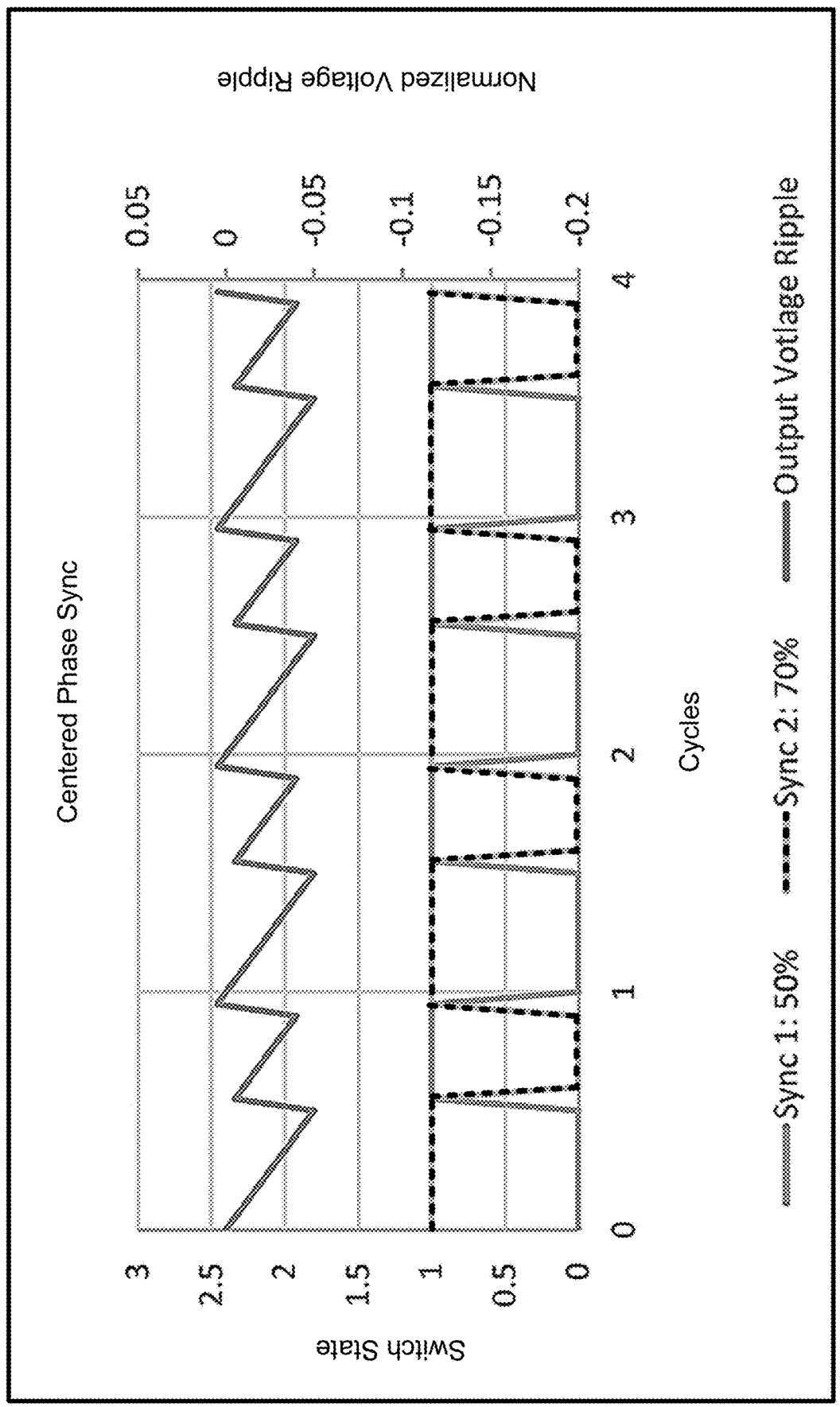
FIG. 7 is a diagram for power management.

FIG. 7 plots the phases of the sync switches (e.g., the sync switch 111, the sync switch 112) in relation to the output voltage ripple (based on the center of the phases of the respective signals) when the control model 120 causes the sync switches (e.g., the sync switch 111, the sync switch 112) to deliver current to the output of the system 100 at the same time. Any surplus current may cause a sharp increase in voltage at the output of the system 100. The sharp increase in voltage may be followed by a gradual reduction in the output voltage whenever the load current is not sustained for a single phase of the system 100. Notably FIG. 7 illustrates inverse system behavior in relation to the previous description (e.g., system behavior depicted in FIG. 6).

As described, the control module 120 may modify timing for each phase of the multiphase cycle of the system 100. For example, the control module 120 may modify the timing for each phase of the multiphase cycle by delaying, based on the conductive state of the respective source to the load, each phase of the multiphase cycle so that each transition time between each phase of the multiphase cycle is equivalent. However, in some instances, the control module 120 modify timing for phases of the multiphase cycle of the system 100 so that the load is "off" (e.g., a non-active/non-conducting, etc.) for a portion of a phase or multiple phases (e.g., phase pulse skipping, etc.) causing current collected while the load is "off" to be distributed/delivered to the load during the "on" time (e.g., the active/conducting duration) for a phase. For example, the system 100 may be used to provide power to an electromechanical device that requires a period of recharge after transferring energy to (e.g., stimulating, etc.) muscle fibers. The control module 120 may modify timing for each phase of the multiphase cycle of the system 100 based on the parameters of a load and/or a desired power output by the system 100.

Figure 8:
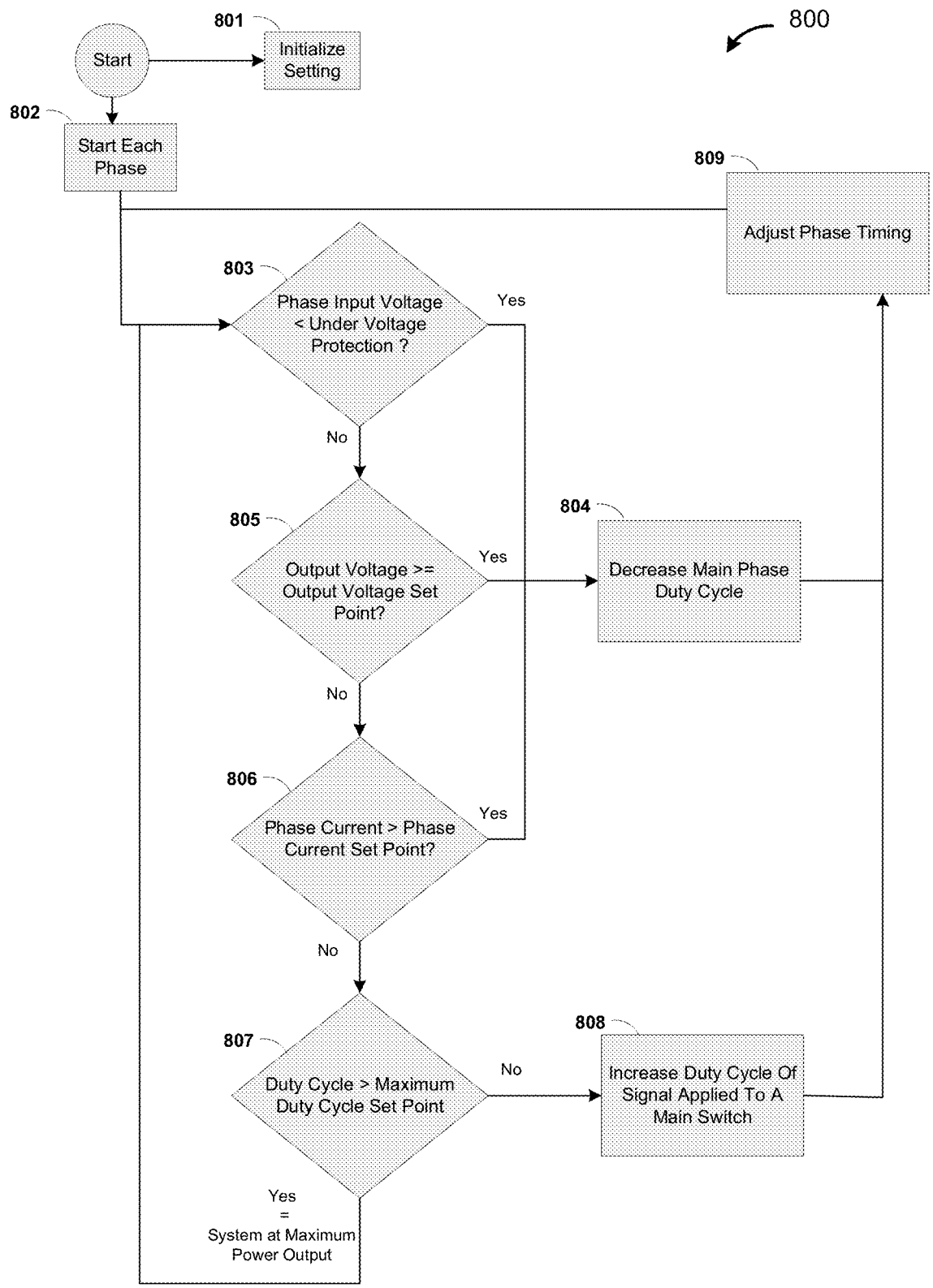
FIG. 8 is a flowchart of an example method for power management.

FIG. 8 is a flowchart of a method 800 for power management. A control module (e.g., the control module 120, a controller/driver, etc.) may be configured with a plurality of power converters to form a power management system (e.g., the system 100, etc.). The system may be an n-th phase (multi-phase) interleaved system where the phases are based on the quantity of sources and associated quantity of power converters. Each power converter of the plurality of power converters may be connected to different source, such as one or more photovoltaic cells of a solar module, one or more cells of a multi-cell battery/source, one or more energy harvesting devices (e.g., thermoelectric devices, etc.), one or more energy harvesting devices configured/embedded within an organic organism (e.g., jellyfish, etc.) and/or organic material (e.g., muscle tissue, etc.), and/or the like. In some cases, the control module and power converters may be embedded with one or more photovoltaic cells of a solar module, one or more cells of a multi-cell battery/source, one or more energy harvesting devices, and/or the like. At 801, settings of the system may be determined. For example, the output voltage may be set to zero volts, all phase currents limit set points may be set to a minimum limit set point, and/or any other desired setting may be determined.

At 802, the system may start. The control module causes the system to initiate with a soft start (via a soft-start algorithm and/or circuit, etc.) to slow down the rate of rising output voltage (based on a maximum output voltage set point) by minimizing any excess current flow during the start. The control module may begin to synchronously control conduction associated with each power converter of the plurality of power converters. The control module may start each phase of the system.

At 803, the control module may determine the amount of input voltage associated with its respective phase. The control module may determine whether the phase input voltage is less than an under voltage protection value. If the phase input voltage is less than the under voltage protection value, the control module may, at 804, cause a decrease in the duty cycle of a main switch (e.g., the main switch 105, the main switch 106, etc.) of a power converter of the plurality of power converters for a given phase. In some instance, a decrease in the duty cycle of a main switch may cause an increase in the duty cycle for a synchronization signal (e.g., a digital control signal, etc.) for the phase. Decreasing the duty cycle of the main switch may cause less power contributed to the output (a load) for the phase. If the phase input voltage is not less than the under voltage protection value, then the control module may, at 805, determine if the output voltage is greater than or equal to an output voltage set point (e.g., a set/desired output voltage level). If the output voltage is greater than or equal to the output voltage set point, the control module may (step 804) cause a decrease in the duty cycle of the main switch (e.g., the main switch 105, the main switch 106, etc.) of the power converter of the plurality of power converters for the phase. If the output voltage is not greater than or equal to the output voltage set point, then the control module may, at 806, determine whether the phase current is greater than a phase current set point. If the phase current is greater than the phase current set point, the control module may (step 804) cause a decrease in the duty cycle of the main switch (e.g., the main switch 105, the main switch 106, etc.) of the power converter of the plurality of power converters for the phase. If the phase current is not greater than the phase current set point, the control module may, at 807, determine whether the duty cycle is greater than a maximum duty cycle set point. If the duty cycle is greater than the maximum duty cycle set point then it may be assumed that the system has exceeded the performance of the boost converter phase and the control module may again determine if the phase input voltage is less than the under voltage protection value (e.g., the control module may return to step 803, etc.). In some instances, steps 803 and 805-807 may be performed/executed concurrently. In some instances, steps 803 and 805-807 may be performed/executed sequentially. If the duty cycle is not greater than the maximum duty cycle set point, the control module may, at 808, cause an increase in the duty cycle of the main switch (e.g., the main switch 105, the main switch 106, etc.) of the power converter of the plurality of power converters for the given phase. Increasing the duty cycle may cause more power to be contributed to the output (a load) from the phase.

At 809, the control module may adjust phase timing. For example, for a two-phase system, the control module may adjust the phase timing for half phase delay on the center of a synchronization signal (e.g., a digital control signal, etc.) for the phase. Adjusting the phase timing for half phase delay on the center of the synchronization signal for the phase may cause a reduction in output voltage ripple and cause an output that requires less filtering. The control module may adjust phase timing for any multiphase system to reduce output voltage ripple and filtering requirements.

In some instances, the control module may perform maximum power point tracking of the system. For example, after the soft start voltage ramp, the control module may, for each phase, determine the phase input voltage and the phase current to determine a phase current set point and adjust the phase current set point to ensure optimal power output of the system.

Figure 9:
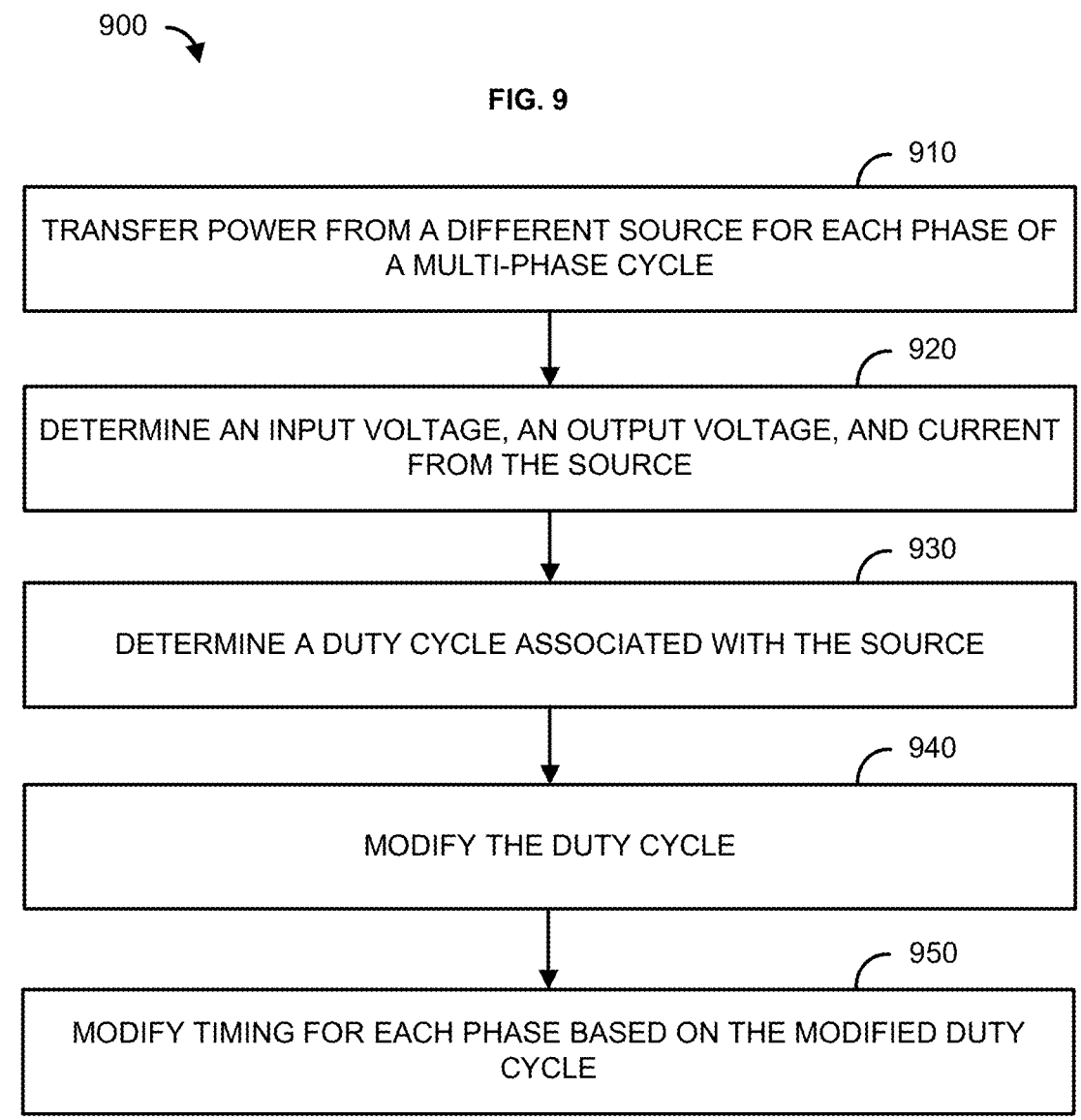
FIG. 9 is a flowchart of an example method for power management.

In an embodiment, illustrated in FIG. 9, the system 100, and/or any other device/component described herein can be configured to perform a method 900. At 910, power may be transferred to a load. For example, a system may include a control module and two or more power converters configured (e.g., embedded, etc.) with a power source(s), such as cells of a photovoltaic module (e.g., a solar module, one or more photovoltaic cells of a photovoltaic cell-string, etc.), one or more cells of a multi-cell battery, one or more energy storing current sources, one-or-more electrodes harvesting energy individually from a non-discrete power source (e.g., perovskite-painted surfaces, etc.), one or more energy-harvesting devices, one or more thermoelectric devices, and/or the like. The control module may cause optimal power (e.g., wattage) to be transferred from the power source (e.g., components of the power source, etc.) to a load (e.g., a power inverter, an energy storage device, a heating element, a resistive load, an inductive load, a capacitive load, etc.) while minimizing transients (e.g., inductive switching transients, etc.). The control module may transfer, for each phase of a multiphase cycle, power from a different source of a plurality of sources to a load. The control module may transfer the power by managing switching/activation operations of each phase.

At 920, the control module may determine, for each phase of the multiphase cycle, an input voltage associated with the transferred power, an output voltage associated with the transferred power, and input current from the source associated with the transferred power. For example the control module may be configured with and/or in communication with one or more sensing circuits/modules that determine/detect the input voltage associated with the transferred power, the output voltage associated with the transferred power, and the input current from the source associated with the transferred power.

At 930, the control module may determine a duty cycle associated with the source.

At 940, the control module may modify the output voltage associated with the transferred power, the current from the source, and or the duty cycle associated with the source. The control module may cause such modifications based on the input voltage associated with the transferred power. The duty cycle associated with the source may be increased or decreased based on one or more of the input voltage not satisfying an input voltage level threshold, the output voltage satisfying an output voltage level threshold, or the input current from the source exceeding a current level threshold.

At 950, the control module may modify timing for each phase of the multiphase cycle. The control module may modify the timing for each phase of the multiphase cycle based on the modified duty cycle. For example, modifying the timing for each phase of the multiphase cycle may include delaying, based on the conductive state of the respective source to the load, each phase of the multiphase cycle so that each transition time between each phase of the multiphase cycle is equivalent.

Figure 10:
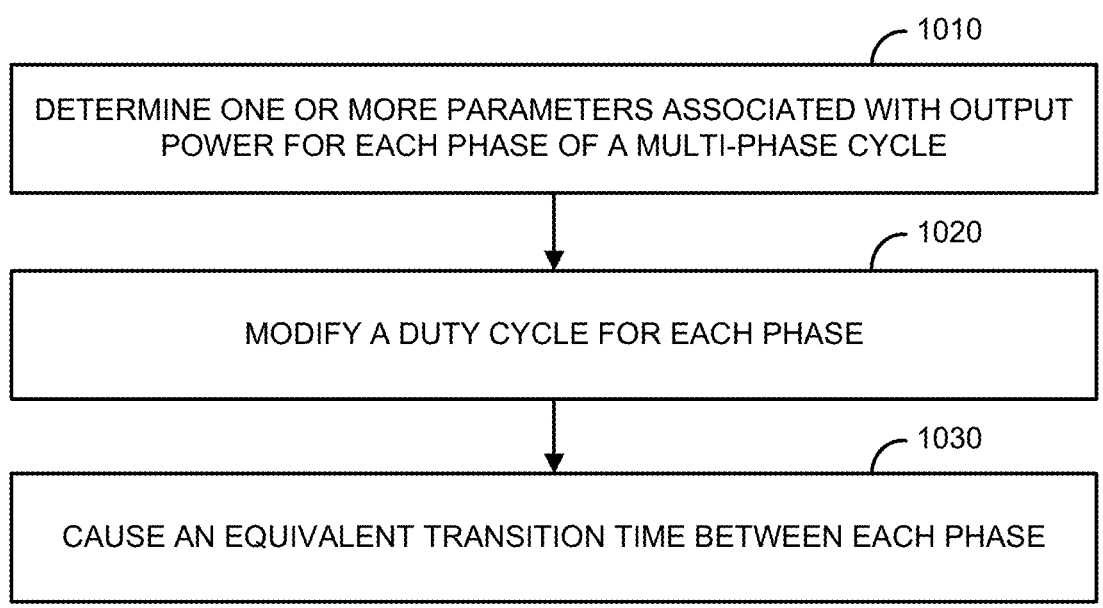
FIG. 10 is a flowchart of an example method for power management.

In an embodiment, illustrated in FIG. 10, the system 100, and/or any other device/component described herein can be configured to perform a method 1000. At 1010, one or more parameter values associated with output power may be determined. For example, a system may include a control module and one or more power converters configured (e.g., embedded, etc.) with a power source(s), such as cells of a photovoltaic module (e.g., solar module, etc.), one or more cells of a multi-cell battery, one or more energy storing current sources, one-or-more electrodes harvesting energy individually from a non-discrete power source (e.g., perovskite-painted surfaces, etc.), one or more energy-harvesting devices, one or more thermoelectric devices, and/or the like. The control module may cause optimal power (e.g., wattage) to be transferred from the power source (e.g., components of the power source, etc.) to a load (e.g., a power inverter, an energy storage device, a heating element, a resistive load, an inductive load, a capacitive load, etc.) while minimizing transients (e.g., output voltage transients such as transients caused by intermittent current to the load from switched mode power supplies, etc.). The control module may transfer, for each phase of a multiphase cycle, power from a different source of a plurality of sources to a load. The control module may transfer the power by managing switching/activation operations of each phase. The one or more parameters may include an input voltage value associated with the transferred power, an output voltage value associated with the transferred power, and/or an input current level from the source associated with the transferred power.

At 1020, the duty cycle of a synchronization switching component associated with a given phase may be modified. The control module may modify the duty cycle based on the one or more parameter values. For example, the control module may determine whether the input voltage value satisfies an input voltage level threshold (e.g., an under voltage set point, etc.), whether the output voltage value satisfies an output voltage level threshold (e.g., greater than or equal to an output voltage set point, etc.), or the current from the source exceeding a current level threshold (e.g., is phase current greater than a phase current set point, etc.), and increase/decrease the duty cycle accordingly.

At 1030, the transition time between each phase of the multiphase cycle may be adjusted to be equivalent. The control module may cause, based on the modified duty cycle for each phase of the multiphase cycle, an equivalent transition time between each phase of the multiphase cycle. The equivalent transition times may cause a reduction in output voltage ripple so that filtering requirements of the system are reduced.

Figure 11:
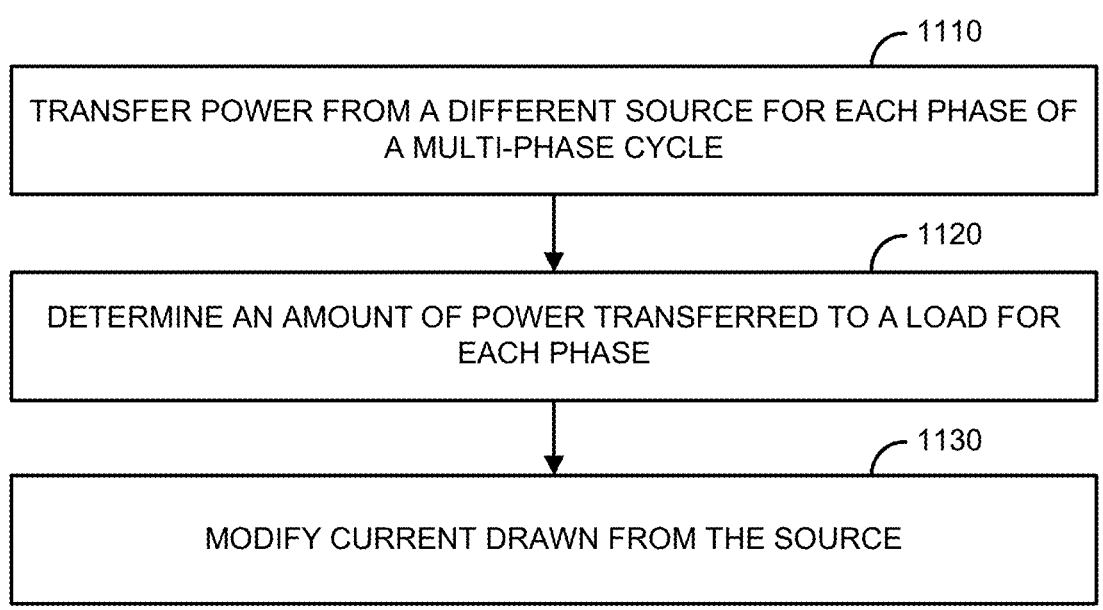
FIG. 11 is a flowchart of an example method for power management.

In an embodiment, illustrated in FIG. 11, the system 100, and/or any other device/component described herein can be configured to perform a method 1100. At 1110, power may be transferred to a load. For example, a system may include a control module and one or more power converters configured (e.g., embedded, etc.) with a power source(s), such as cells of a photovoltaic module (e.g., solar module, etc.), one or more cells of a multi-cell battery, one or more energy storing current sources, one-or-more electrodes harvesting energy individually from a non-discrete power source (e.g., perovskite-painted surfaces, etc.), one or more energy-harvesting devices, one or more thermoelectric devices, and/or the like. The control module may cause optimal power (e.g., wattage) to be transferred from the power source (e.g., components of the power source, etc.) to a load (e.g., a power inverter, an energy storage device, a heating element, a resistive load, an inductive load, a capacitive load, etc.) while minimizing transients (e.g., output voltage transients such as transients caused by intermittent current to the load from switched mode power supplies, etc.). The control module may transfer, for each phase of a multiphase cycle, power from a different source of a plurality of sources to a load. The control module may transfer the power by managing switching/activation operations of each phase.

At 1120, an amount of power transferred from the source to the load may be determined. For example, the control module may be in communication with (connected to) one or more sensors (sensing circuits) that detect/determine, based on an input voltage associated with source and current drawn from the source, the amount of power transferred from the source to the load.

At 1130, an amount of current drawn from the source may be modified. The control module may modify, based on the amount of power transferred from the source to the load, current drawn from the source. As described, the control module may perform maximum power point tracking and adjust the system accordingly.

The following examples are put forth so as to provide those of ordinary skill in the art with a complete disclosure and description of how the compounds, compositions, articles, devices and/or methods claimed herein are made and evaluated, and are intended to be purely exemplary and are not intended to limit the scope of the methods and systems. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric.

Embodiment 1

A method comprising: transferring, for each phase of a multiphase cycle, power from a different source of a plurality of sources to a load, determining, for each phase of the multiphase cycle, an input voltage associated with the transferred power, an output voltage associated with the transferred power, and current from the source associated with the transferred power, determining a duty cycle associated with the source, modifying, based on the input voltage associated with the transferred power, one or more of the output voltage associated with the transferred power, the current from the source, or the duty cycle associated with the source, wherein the modified duty cycle comprises an increase or a decrease in the duty cycle associated with the source based on one or more of the input voltage not satisfying an input voltage level threshold, the output voltage satisfying an output voltage level threshold, or the current from the source exceeding a current level threshold, and modifying, based on the modified duty cycle, timing for each phase of the multiphase cycle.

Embodiment 2

The embodiment as in any one of the preceding embodiments wherein modifying the timing for each phase of the multiphase cycle comprises delaying, based on the conductive state of the respective source to the load, each phase of the multiphase cycle so that each transition time between each phase of the multiphase cycle is equivalent.

Embodiment 3

The embodiment as in any one of the preceding embodiments, wherein the plurality of sources comprise one or more photovoltaic cells of a photovoltaic cell-string, one or more cells of a multi-cell battery, one or more energy storing current sources, one or more thermoelectric device, or one or more energy-harvesting devices, or one-or-more electrodes harvesting energy individually from a non-discrete power source.

Embodiment 4

The embodiment as in any one of the preceding embodiments, wherein the load comprises one or more electrophysical stimulation devices associated with an organic organism.

Embodiment 5

The embodiment as in any one of the preceding embodiments wherein each phase of the multiphase cycle is associated with a direct current-to-direct current (DC-DC) boost converter.

Embodiment 6

The embodiment as in embodiment 1, wherein, wherein modifying the timing for each phase of the multiphase cycle causes, based on a phase skipping control algorithm, power to not transfer to the load for at least one phase of the multiphase cycle.

Embodiment 7

A method comprising: determining, for each phase of a multiphase cycle, one or more parameter values associated with output power, modifying, based on the one or more parameter values, the duty cycle of a synchronization switching component associated with the phase, and causing, based on the modified duty cycle for each phase of the multiphase cycle, an equivalent transition time between each phase of the multiphase cycle.

Embodiment 8

The embodiment of embodiment 7 wherein causing the equivalent transition time between each phase of the multiphase cycle comprises modifying the phase timing for each phase of the multiphase cycle based on the center on a synchronization signal associated with each phase of the multiphase cycle.

Embodiment 9

A method comprising: transferring, for each phase of a multiphase cycle, power from a different source of a plurality of sources to a load, determining, for each phase of the multiphase cycle, based on an input voltage associated with source and current drawn from the source, an amount of power transferred from the source to the load, and modifying, based on the amount of power transferred from the source to the load, current drawn from the source.

Embodiment 10

The embodiment of embodiment 9 wherein modifying the current drawn from the source comprises causing, based on determining that the amount of power transferred from the source to the load does not satisfy a threshold, an increase or a decrease in the current drawn from the source.

Embodiment 11

The embodiment of embodiment 9 or embodiment 10, further comprising sending current from the load to the source.

While the methods and systems have been described in connection with preferred embodiments and specific examples, it is not intended that the scope be limited to the particular embodiments set forth, as the embodiments herein are intended in all respects to be illustrative rather than restrictive.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is in no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

It will be apparent to those skilled in the art that various modifications and variations can be made without departing from the scope or spirit. Other embodiments will be apparent to those skilled in the art from consideration of the specification and practice disclosed herein. It is intended that the specification and examples be considered as exemplary only, with a true scope and spirit being indicated by the following claims.

What is claimed is:

1. A managed power supply system, comprising:
a plurality of power sources;
a control module coupled to the plurality of power sources and comprising one or more processors and a memory, the memory storing processor executable instructions that, when executed by the one or more processors, cause the one or more processors to control the power output of the power sources in a multiphase cycle;
wherein for each phase of the multiphase cycle, the one or more processors:
transfer power from a selected power source of the plurality of power sources;
determine an input voltage associated with the transferred power, an output voltage associated with the transferred power, and current from the selected power source;
determine, for each power source of the plurality of power sources, a duty cycle;
modify, based on the input voltage associated with the transferred power for each phase, the output voltage associated with the transferred power for each phase of the multiphase cycle, the current from respective power source associated with the transferred power for each phase of the multiphase cycle, and the duty cycle associated with each respective power source.

2. The system of claim 1, wherein the one or more processors further modify, based on the modified duty cycle, timing for each phase of the multiphase cycle.

3. The system of claim 1, wherein, for each power source, the modified duty cycle comprises an increase or a decrease in the duty cycle based on one or more of the input voltage not satisfying an input voltage level threshold, the output voltage satisfying an output voltage level threshold, or the current from the voltage source exceeding a current level threshold.

4. The system of claim 1, wherein the one or more processors further delays each phase of the multiphase cycle, based on a conductive state of the respective power source, so that each transition time between each phase of the multiphase cycle is equivalent.

5. The system of claim 1, wherein the control module further performs maximum power point tracking.

6. The system of claim 5, wherein the control module performs maximum power point tracking by, for each phase, determining the phase input voltage and the phase current to determine a phase current set point and adjusting the phase current set point to ensure optimal power output of the power source.

7. The system of claim 5, wherein each of the plurality of power sources comprises a power converter and the control module performs maximum power point tracking by managing the duty cycle of the power converter.

8. The system of claim 1, further comprising a plurality of power converters, wherein each phase of the multiphase cycle is associated with a power converter of the plurality of power converters.

9. The system of claim 8, wherein each of the plurality of power converters comprises a boost converter.

10. The system of claim 8, wherein each of the plurality of power converters comprises a main switch and wherein the control module cyclically causes the main switch to conduct electricity through an inductor.

11. The system of claim 10, wherein each of the power converters further comprises a sync switch enabling discharge of the inductor.

12. The system of claim 8, wherein each of the plurality of power converters comprises a main switch and an inductor, and wherein the main switch is coupled to the inductor whereby current from a respective power source flows through the inductor and the main switch in series when the main switch assumes an on position.

13. The system of claim 12, wherein each of the power converters further comprises a sync switch enabling discharge of the inductor.

14. The system of claim 1, wherein the one or more processors controls each duty cycle by activating switches to control current flow into and out of an inductor.

15. The system of claim 1, wherein each power source of the plurality of power sources comprises a cell of a photovoltaic cell string or a cell of a multi-cell battery.

16. The system of claim 1, wherein the one or more processors modifies timing for phases of the multiphase cycle to suspend transferring power for a portion of a phase or for multiple phases, thereby causing phase pulse skipping.

17. The system of claim 1, wherein the one or more processors modifies the output voltage associated with the transferred power for selected phases of the multiphase cycle to be set to zero volts.

18. A managed power supply system, comprising:
a plurality of power cells;

a plurality of power converters, each coupled to a power cell of the plurality of power cells;

a control module coupled to the plurality of power converters and comprising one or more processors and a memory, the memory storing processor executable instructions that, when executed by the one or more processors, cause the one or more processors to control the power output of the power cells in a multiphase cycle;

wherein for each phase of the multiphase cycle, the one or more processors:

transfer power from a selected power cell of the plurality of power cells;

determine an input voltage associated with the transferred power, an output voltage associated with the transferred power, and current from the selected power cell;

determine, for each power converter of the plurality of power converters, a duty cycle;

modify the power transferred from respective power source associated with the transferred power for each phase of the multiphase cycle.

19. The system of claim 18, wherein each of the power converters comprises a switching arrangement managed by the control module to control current flow through an inductor.

20. The system of claim 19, wherein the switching arrangement comprises a main switch controlling current flow from a respective power cell through the inductor to ground and a sync switch controlling flow of current from the inductor to a load.

21. The system of claim 18, wherein the control module controls the current flow through an inductor by controlling the duty cycle associated with each respective power cell.

22. The system of claim 18, wherein each phase of the multiphase cycle is associated with one of the plurality of power converters.

23. The system of claim 18, wherein each of the plurality of power cells comprises one of: a photovoltaic cell of a photovoltaic string, a string of photovoltaic cells, a battery cell of a multi-cell battery, a string of battery cells.

24. The system of claim 18, wherein the control module modifies timing for phases of the multiphase cycle to suspend transferring power for a portion of a phase or for multiple phases.

25. The system of claim 18, wherein the control module sets output voltage to zero volts for phases of the multiphase cycle to suspend transferring power for a portion of a phase or for multiple phases.

* * * * *